United States Patent
Ren et al.

(10) Patent No.: US 9,105,798 B2
(45) Date of Patent: Aug. 11, 2015

(54) PREPARATION OF CIGS ABSORBER LAYERS USING COATED SEMICONDUCTOR NANOPARTICLE AND NANOWIRE NETWORKS

(71) Applicant: Sun Harmonics Ltd, Hangzhou (CN)

(72) Inventors: Yuhang Ren, Hangzhou (CN); Paifeng Luo, Hangzhou (CN); Bo Gao, Hangzhou (CN)

(73) Assignee: SUN HARMONICS, LTD, Zhejian (CN)

( * ) Notice: Subject to any disclaimer, the term of this patent is extended or adjusted under 35 U.S.C. 154(b) by 15 days.

(21) Appl. No.: 13/893,756

(22) Filed: May 14, 2013

(65) Prior Publication Data
US 2014/0342495 A1    Nov. 20, 2014

(51) Int. Cl.
*H01L 31/18*    (2006.01)
*H01L 31/032*   (2006.01)
*C09D 11/02*    (2014.01)

(52) U.S. Cl.
CPC ............ *H01L 31/18* (2013.01); *H01L 31/0322* (2013.01); *C09D 11/02* (2013.01); *Y02E 10/541* (2013.01); *Y02E 10/544* (2013.01)

(58) Field of Classification Search
CPC ............ H01L 31/0322; H01L 31/1844; H01L 31/0749; H01L 31/18; C09D 11/02; Y02E 10/541; Y02E 10/544
See application file for complete search history.

(56) References Cited

U.S. PATENT DOCUMENTS

| | | | |
|---|---|---|---|
| 6,258,620 B1* | 7/2001 | Morel et al. | 438/57 |
| 6,268,014 B1* | 7/2001 | Eberspacher et al. | 427/74 |
| 7,604,843 B1* | 10/2009 | Robinson et al. | 427/376.6 |
| 7,915,072 B1 | 3/2011 | Chuang | |
| 7,922,804 B2* | 4/2011 | Chuang | 106/287.18 |
| 8,048,477 B2* | 11/2011 | Van Duren et al. | 427/74 |
| 8,101,498 B2* | 1/2012 | Pinnington et al. | 438/455 |
| 8,231,848 B1* | 7/2012 | Ren et al. | 423/23 |
| 2002/0006470 A1* | 1/2002 | Eberspacher et al. | 427/216 |

(Continued)

FOREIGN PATENT DOCUMENTS

| | | |
|---|---|---|
| WO | WO2010085553 A1 | 7/2010 |
| WO | WO2012161401 A1 | 11/2012 |

OTHER PUBLICATIONS

Ahn et al., Nanoparticle derived Cu(In, Ga)Se2 absorber layer for thin film solar cells, Colloids and Surfaces A: Physicochem. Eng. Aspects 313-314 (2008) 171-174.*

(Continued)

*Primary Examiner* — Bac Au
*Assistant Examiner* — Sophia Nguyen
(74) *Attorney, Agent, or Firm* — Lackenbach Siegel, LLP; Myron Greenspan (57) ABSTRACT

A method of preparing $Cu(In,Ga)SSe_2$ $Cu(In,Ga)$ $(S,Se)_2$ (CIGSS) absorber layers uses coated semiconductor nanoparticle and nanowire networks. The nanoparticles and nanowires containing one or more elements from group IB and/or IIIA and/or VIA are prepared from metal salts such as metal chloride and acetate at room temperature without inert gas protection. A uniform and non-aggregation CIGS precursor layer is fabricated with the formation of nanoparticle and nanowire networks utilizing ultrasonic spaying technique. High quality CIGSS film is obtained by cleaning the residue salts and carbon agents at an increased temperature and selenizing the pretreated precursor layer.

14 Claims, 8 Drawing Sheets

(56) References Cited

U.S. PATENT DOCUMENTS

| | | | |
|---|---|---|---|
| 2007/0111367 A1* | 5/2007 | Basol | 438/95 |
| 2008/0044570 A1* | 2/2008 | Meyer et al. | 427/250 |
| 2008/0149176 A1* | 6/2008 | Sager et al. | 136/262 |
| 2009/0145482 A1* | 6/2009 | Mitzi et al. | 136/262 |
| 2009/0214763 A1* | 8/2009 | Joo et al. | 427/76 |
| 2009/0260670 A1* | 10/2009 | Li | 136/244 |
| 2011/0008927 A1* | 1/2011 | Huang et al. | 438/95 |
| 2011/0065228 A1* | 3/2011 | Li | 438/94 |
| 2011/0206599 A1* | 8/2011 | Keszler et al. | 423/508 |
| 2011/0303122 A1* | 12/2011 | Carlini et al. | 106/496 |
| 2012/0061247 A1* | 3/2012 | Ahmed et al. | 205/170 |
| 2012/0080091 A1* | 4/2012 | Min et al. | 136/262 |
| 2012/0098032 A1 | 4/2012 | Guo et al. | |
| 2012/0115312 A1* | 5/2012 | Agrawal et al. | 438/478 |
| 2012/0164762 A1* | 6/2012 | Yu et al. | 438/15 |
| 2012/0192930 A1* | 8/2012 | Fox et al. | 136/252 |
| 2012/0302002 A1* | 11/2012 | Wieting | 438/93 |
| 2013/0045565 A1* | 2/2013 | Ahn et al. | 438/95 |
| 2013/0059410 A1* | 3/2013 | Yu et al. | 438/62 |
| 2013/0171768 A1* | 7/2013 | Wu et al. | 438/95 |
| 2013/0206232 A1* | 8/2013 | Korgel et al. | 136/262 |
| 2013/0230427 A1* | 9/2013 | Lin et al. | 422/69 |
| 2014/0109966 A1* | 4/2014 | Min et al. | 136/262 |
| 2014/0134791 A1* | 5/2014 | Vail et al. | 438/102 |

OTHER PUBLICATIONS

Research Project, retrieved from website hunter.cuny.edu/physics/faculty/ren/repository/files/Project1.pdf.*

Ham et al., Preparing of CIGS nanoparticles using one step synthesis, 217th ECS Meeting, Abstract #338, © The Electrochemical Society.*

Nguyen et al., Making nanoparticle ink for compound solar cells, SPIE Newsroom: SPIE, 2013.*

Wang et al., Inkjet printed chalcopyrite CuInxGa1-xSe2 thin film solar cells, Solar Energy Materials & Solar Cells 95 (2011) 2616-2620.*

Zhang et al., Fabrication and Characterization of Thin Film Solar Cell Made from CuIn0.75Ga0.25S2 Wurtzite Nanoparticles, Hindawi Publishing Corporation, Journal of Nanomaterials, vol. 2013, Article ID 320375, 5 pages.*

Wang et al., 8.01% CuInGaSe2 solar cells fabricated by air-stable low-cost inks, Phys. Chem. Chem. Phys., 2012, 14, 11154-11159.*

A nanoparticle ink printing process for all printed thin film copper-indium-selenide (CIS) solar cells, X. Charles Li et al. Nanoscale Photonic and Cell Technologies for Photovoltaics, edited by Loucas Tsakalakos, Proc. of SPIE vol. 7047, 70470E, (2008) • 0277-786X/08/$18 • doi: 10.1117/12.794946.

Development of a hybrid sputtering/evaporation process for Cu(In,Ga)Se2 thin film solar cells M. Acciarri et al. Crystal Research and Technology Special Issue: Italien Crystal Growth Conference 2010 (ICG2010) vol. 46, Issue 8, pp. 871-876, Aug. 2011.

Layer-by-Layer Nanoassembly of Copper Indium Gallium Selenium Nanoparticle Films for Solar Cell Applications A. Hemati et al. Journal of Nanomaterials vol. 2012 (2012), Article ID 512409, 6 pages doi:10.1155/2012/512409.

Non-vacuum methods for formation of Cu(In,Ga)(Se, S)2 thin film photovoltaic absorbers C. J. Hibberd et al. Progress in Photovoltaics: Research and Applications Special Issue: Chalcopyrite Thin Film Solar Cells vol. 18, Issue 6, pp. 434-452, Sep. 2010.

Cu (In,Ga)Se2 thin films and solar cells prepared by selenization of metallic precursors Bülent M. Basol et al. Journal of Vacuum Science & Technology A / vol. 14 / Issue 4 (1996).

Improvement of Film Quality in CuInSe2 Thin Films Fabricated by a Non-Vacuum, Nanoparticle-Based Approach Yiwen Zhang et al. Japanese Journal of Applied Physics 50 (2011) 04DP12.

Non-vacuum deposition of Cu(In,Ga)Se2 absorber layers from binder free, alcohol solutions, Alexander R. Uhl et al. Progress in Photovoltaics: Research and Applications Prog. Photovolt: Res. Appl. 2012; 20:526-533 Published online Jan. 31, 2012 in Wiley Online Library (wileyonlinelibrary.com). DOI: 10.1002/pip.1246.

Isothermal and Two-Temperature Zone Selenization of Mo Layers L. Kaupmees et al. Hindawi Publishing Corporation Advances in Materials Science and Engineering vol. 2012, Article ID 345762, 11 pages doi:10.1155/2012/345762.

Nanoparticle derived Cu(In, Ga)Se2 absorber layer for thin film solar cells SeJin Ahn et al. Colloids and Surfaces A: Physicochemical and Engineering Aspects vols. 313-314, Feb. 1, 2008, pp. 171-174.

Development of Low Cost CIGS Solar Cell MNRE Supported Project @ Moser Baer India Ltd R&D Conclave Aug. 9, 2012.

Fabrication of CuInGaSe2 Thin Film Solar Cells using Low-cost Air-stable Inks Wei Wang An Abstract of the Dissertation of Wei Wang for the degree of Doctor of Philosophy in Chemical Engineering presented on Jul. 5, 2012.

* cited by examiner

PREPARATION OF CIGS ABSORBER LAYERS USING COATED SEMICONDUCTOR NANOPARTICLE AND NANOWIRE NETWORKS

BACKGROUND OF THE INVENTION

1. Field of the Invention

The present invention relates to a method synthesizing $Cu(In,Ga)S_2$ nanoparticles/wires based on metal salts.

2. Description of the Prior Art

A CIGS thin film is prepared by the formation of semiconductor nanoparticle and nanowire networks and selenization for a light absorption layer of photovoltaic devices.

Chalcopyrite $CuInGaSe_2$ CIGSe is a direct band gap semiconductor and has an exceptionally high absorption coefficient of more than $10^5$/cm for 1.5 eV and higher energy photons. According to the recent report from the ZSW, a solar cell based on CIGSe has reached a power conversion efficiency of 20.3%, which is comparable with the energy conversion efficiency of crystalline Si solar cells. Decent conversion efficiency and high chemical stability of CIGSe make itself a promising p-type material for thin film photovoltaic devices.

Vacuum and non-vacuum technologies are the two main methods of preparing CIGSe thin films. Vacuum-based processes including co-evaporation and sputtering, which have been successfully applied in commercial production lines. However, the high cost and complexity of vacuum-based fabrication process become barriers to affordable commercial modules.

An efficient non-vacuum printing process has the potential to overcome this barrier. The low cost technique is inherently suitable for large-scale applications and may benefit from established industries of coatings, paints, inks, electronic ceramics and colloidal systems. In particular, deposition at atmospheric environment offers an opportunity for the deposition of absorber materials at large scale with high throughput. This provides a potential cost advantage over conventional fabrication process that involves expensive vacuum equipment.

Kapur et at (U.S. Pat. No. 6,127,202) describe a method for fabricating a CIGSe solar cell based upon the solution-based deposition of a source material comprised of mechanically milled, oxide-containing, sub-micron sized particles, while Eberspacher and Pauls (U.S. Pat. No. 6,268,014); Published U.S. Patent Application No. 2002/0006470) describe the forming of mixed metal oxide, sub-micron sized particles by pyrolizing droplets of a solution, then ultrasonically spraying the resulting particles onto a substrate. However, the high-temperature hydrogen reduction step is potentially explosive and requires substantial time and energy. Meanwhile, highly toxic $H_2Se$ gas atmosphere is requested in the selenization process. Byoung Koun Min in Published U.S. Patent Application No. 2012/0080091 A1 also involves the reduction process.

Fuqiang Huang in Published U.S. Patent Application No. 2011/0008927 A1 gets a 14.6% high efficiency employing a non-vacuum liquid-phase chemical technique.

David B. Mitzi. in Published U.S. Patent Application No. 2009/0145482 also gets above 10% efficiency CIGSe thin film solar cells using hydrazine as the solvent source.

Nanosolar Inc. in Published U.S. Patent Application No. 2008/0149176 has used binary copper selenide and indium/gallium selenides nanoparticles as starting materials to fabricate 14% thin film CIGSe solar cells. Single metallic nanoparticles are the simplest form one could design. The structure of nanoparticles used by Nanosolar has a core-shell structure. Copper nanoparticles serve as the cores which are coated with IIIA-VIA shells such as indium selenide, gallium selenide etc. These selenide nanoparticles are dispersed in organic solution which may contain various ingredients including solvents, surfactants, binders, emulsifiers, thickening agents, film conditioners, anti-oxidants, flow and leveling agents, plasticizers and preservatives. By using the similar core shell strategy, Yoon et al. synthesized CuSe/InSe nanoparticles which yield only ~1% efficiency.

However, those methods mentioned here require toxic reagents, need inert gas protection, require complex processes and are not easy to scale up to mass production. Thus, there is a need in the art, for a non-oxide, nanoparticle based precursor material that overcomes the above disadvantages.

SUMMARY OF THE INVENTION

In order to solve these problems, the subject invention presents a facile way to synthesize soluble CIGS nanoparticles/wires at room temperature under non-vacuum condition and the reaction can finish in 5 minutes. We employ ultrasonic spray to effectively reduce the aggregation and obtain uniform CIGS precursor films. After heat treatment and selenization, high quality $Cu(In,Ga)SSe_2$ (CIGSS) thin films are prepared. Finally, the effective solar cells based on the non-vacuum method in accordance with the invention are also achieved.

The present invention allows the drawbacks of the known non-vacuum techniques to be eliminated. For this purpose, the invention provides a method for preparing CIGSS absorber layers by using a metal salt, thickening and binding agents to form uniform nanoparticle and nanowire networks and to provide a finished high quality CIGSS film after selenization, in which:

a) CIGS nanoparticles and nanowires are produced based on using a metal salt such as metal chloride and acetate at room temperature without inert gas protection;

b) A CIGS precursor layer is coated on a Mo glass substrate by ultrasonic spraying of the CIGS nanoparticle and nanowire solution;

c) Uniform nanoparticle and nanowire networks are generated by initial heat treatment;

d) A clean CIGS precursor layer is obtained by cleaning the residue salts and carbon agents at an increased temperature above 200° C.;

e) High quality CIGSS film is fabricated after selenizing the pretreated precursor layer at a temperature above 500° C.

BRIEF DESCRIPTION OF THE DRAWINGS

According to the following description and drawings of this invention, the objects and features of the present invention will become apparent, which respectively show.

DETAILED DESCRIPTION OF THE PREFERRED EMBODIMENT

Figure 1:
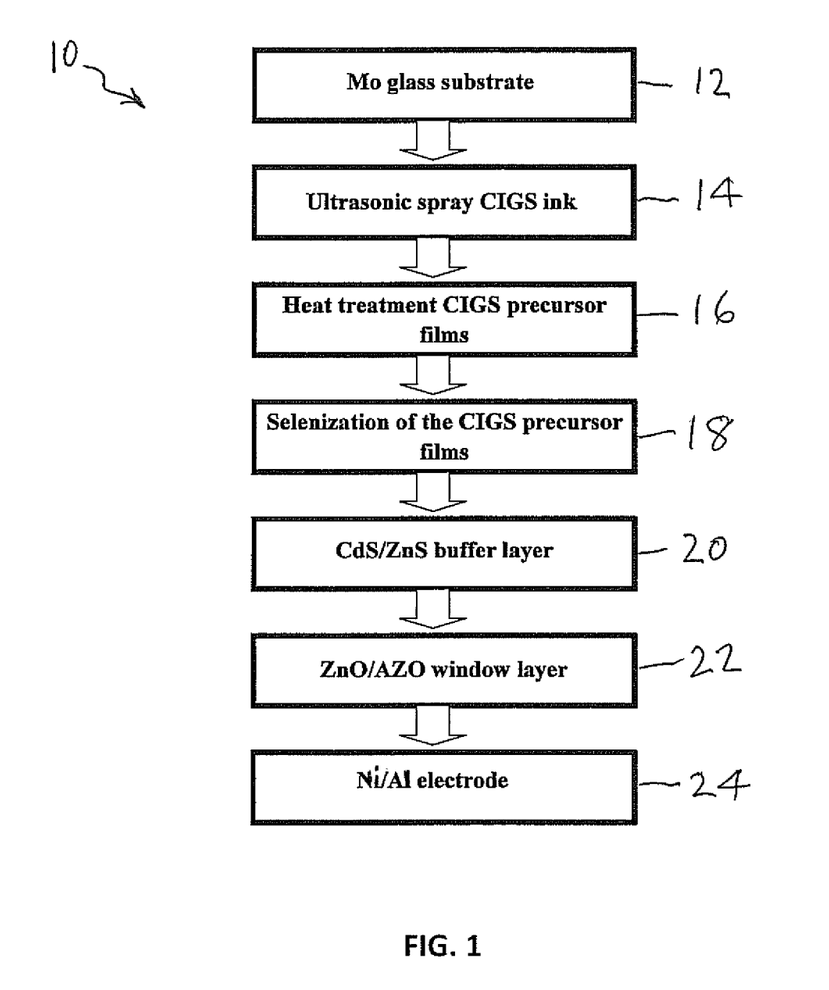
FIG. 1 is a diagram of the fabrication process of CIGS PV device.

FIG. 1 shows the fabrication process of CIGSS photovoltaic ("PV") device.

CIGS nanoparticles/wires have been synthesized using the low-cost solution route under atmospheric conditions in accordance with the present invention. The approach is simpler and less costly than any other non-vacuum methods with the following advantages:

(1) Normal atmosphere fabrication. No need to have inert gas protection;

(2) Short reaction time. The whole synthesis process may only take up to 5 minutes;

(3) Formation of amorphous and soluble nanoparticles/wires. The nanoparticles can be deposited on various substrates and turn into uniform thin films at low temperature (<350° C.);

(4) Low cost and easy to scale-up. The amorphous CIGS nanoparticles fabricated in our invention melt under low temperature (even below 180V) and crystallize to various sizes of nanoparticles with increasing temperature (above 200° C.). We observe such dynamical changes by the color of CIGS nanoparticle solutions: with increasing temperature, the color changes from white to red, then to yellow, finally black. We deposit the nanoparticle-based precursor on the Moly-coated substrate, such as a Mo-coated glass substrate, to form a smooth precursor layer. After typical selenization and typical device fabricating process, we obtain high quality CIGSS films and solar cells.

Figure 2:
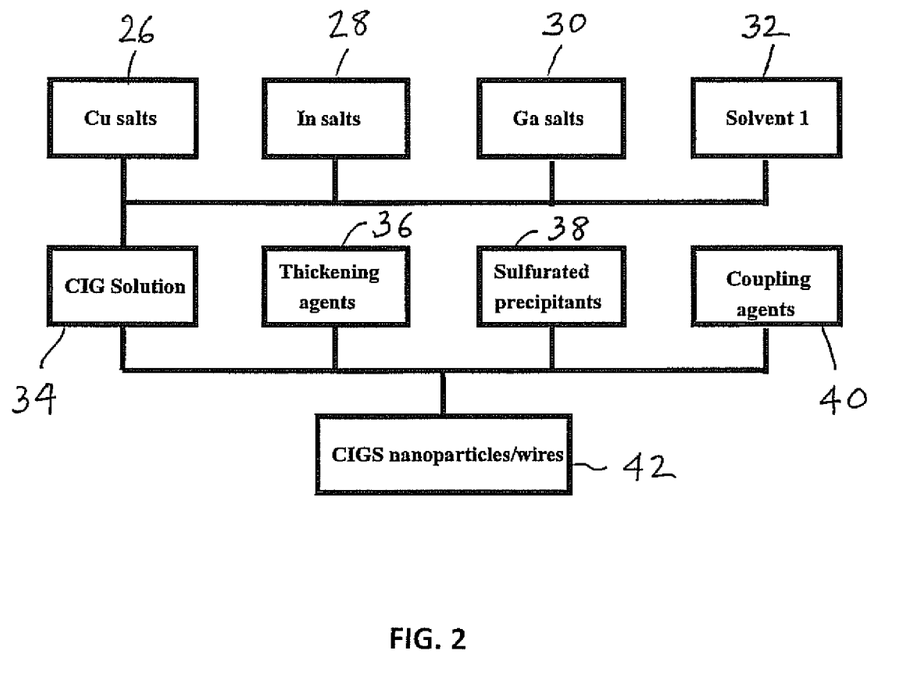
FIG. 2 is a diagram of the synthesis process of CIGS nanoparticles/wires.

In accordance with the present invention, there is provided a method for preparing effective CIGS-based solar cells, comprising the following steps:

(1) Synthesizing the soluble $CuInGaS_2$ nanoparticles/nanowires precursor at room temperature under non-vacuum condition. The process of synthesizing CIGS nanoparticles/nanowires, as shown in FIG. 2, includes the following steps:

(a) Providing a solution comprising Cu, In and Ga ions at 26, 28, 30, respectively, in a solvent at 32, the ratios of Cu, In and Ga ions being in the following proportions: Cu 0.9~1; In 0.6~0.8 and Ga 0.4~0.2 to form the CIG solution at 34;

(b) Providing a thickening solution at 36;

(c) Providing a sulfurated precipitant at 38;

(d) Providing a highly effective coupling agent at 40;

(e) Adding the solution comprising Cu, In and Ga ions into the thickening solution and stirring the mixture to form homogeneous solution;

(f) Sequentially adding appropriate amount of sulfurated precipitant and coupling agent into above homogeneous solution and stirring the mixture to form a CuInGaS2 nanoparticles/nanowires well dispersed solution at 42.

(2) Preparing the CIGS-based ink, adding CIGS powder into specific solvent and adding some additives to form monodispersed CIGS ink. The process of preparing CIGS-based ink includes the following steps:

(a) Separating the CIGS nanoparticles/nanowires by centrifuging method;

(b) Washing and drying the centrifuged CIGS nanoparticles/nanowires under vacuum pump and low temperature;

(c) Providing the high volatilizing solvent with a low boiling point;

(d) Providing a small amount of additives, such as dispersants and thickening agents;

(e) Weighing an appropriate amount of CIGS solid powder, adding into the special organic solvent and some additives, stirring for overnight to form uniform ink.

Figure 3:
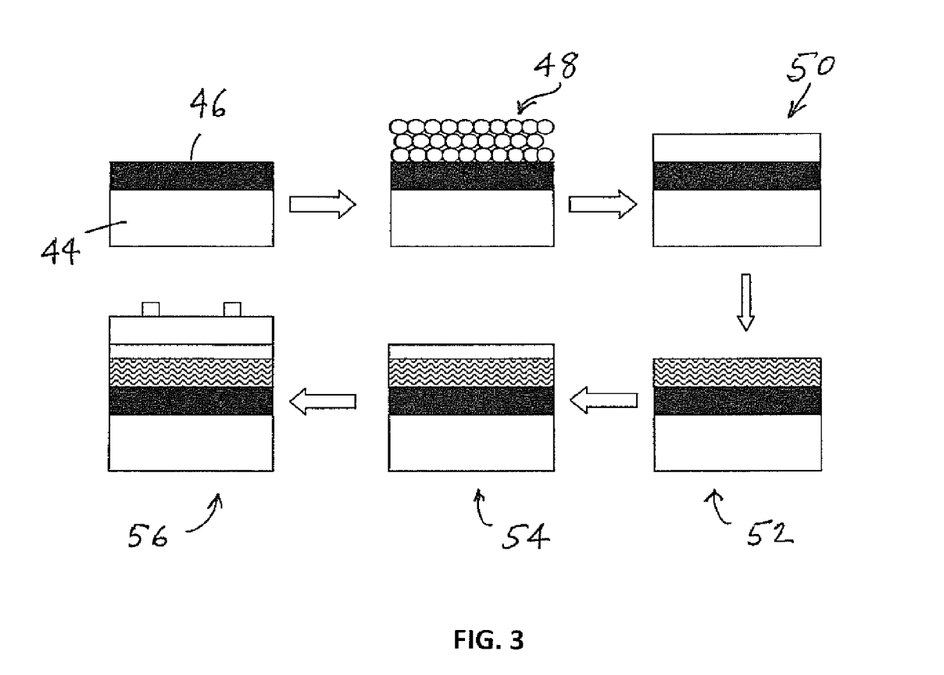
FIG. 3 is a detailed schematic diagram of the process of preparing CIGSS solar cells based on non-vacuum method.

(3) Ultrasonic spraying CIGS ink on Mo glass substrate, using ultrasonic spray to reduce the aggregation effect of CIGS nanoparticles/nanowires and obtaining uniform CIGS precursor films. The process of ultrasonic spraying CIGS-based ink on Mo-coated glass substrate, such as a glass substrate, includes the following steps illustrated in FIG. 3:

(a) Providing a Mo-coated glass substrate at 44;

(b) Providing monodisperse CIGS ink at 46;

(c) Automatically ultrasonic spraying the CIGS ink onto the Mo-glass under 300° C. a plurality of times (e.g. 3 times) at 48. Using ultrasonic spray technology can effectively reduce the aggregation effect and easily provide uniform and non-aggregated CIGS precursor films.

(4) Heating treatment of the CIGS precursor films at 50, the soluble CIGS nanopowder will melt again and change to clear solution, as the temperature improve, the uniform and black color CIGS precursor films are obtained after the solution drying.

(5) Selenizing the heat treated CIGS precursor films at 52 t a temperature above 500 C.°, using Se powder as the Se-source and, high quality CIGSS films will be achieved after selenizing the precursor films in the double zonea furnace (e.g. double zone furnace) for approximately one hour. The process of selenization includes the following steps:

(a) Providing pre-treated CIGS precursor films at 54;

(b) Selenizing the hot-treated precursor films at a temperature above 500 C.° for approximately 30-70 mins in the selenization furnace using Selenium powder as the Se-source, so we can get high-quality CIGSS absorb layer.

Preparing CIGSS device uses typical chemical bath deposition and sputtering and evaporating route. The whole process of fabricating CIGSS PV device includes the following detailed steps:

(a) Depositing buffer layer CdS employing chemical bath deposition ("CBD") method;

(b) Sputtering window layer i-ZnO and conductive AZO layer;

(c) Evaporating Ni/Al top-electrode, at 56, the standard CIGS PV device with structure of glass/Mo/CIGSS/CdS/i-ZnO/AZO/Ni—Al is obtained in our invention. The detailed schematic diagram of whole process of preparing CIGSS solar cells based on non-vacuum method is shown in FIG. 3.

The typical synthesis of CIGS nanoparticles nanowires-based solution is shown as following:

First, synthesis of CuInGa precursor solution A by: Adding $CuCl_2H_2O$ b (e.g. 0.68 g), $InCl_3$ (e.g. 0.74 g) and $GaCl_3$ (e.g. 0.35 g) into 5 mL Methanol, stirring for up to 30 min and a green color solution is obtained.

Second, synthesis of a thickening solution B by: Adding Ethylcellulose (EC) (e.g. 0.3 g) into Terpinol (e.g. 10 mL), stirring overnight and heating to a temperature up to 200° C. until it is completely dissolved.

Then mixing solution A and thickening agent solution B, stirring for up to 5 hours.

Figure 4:
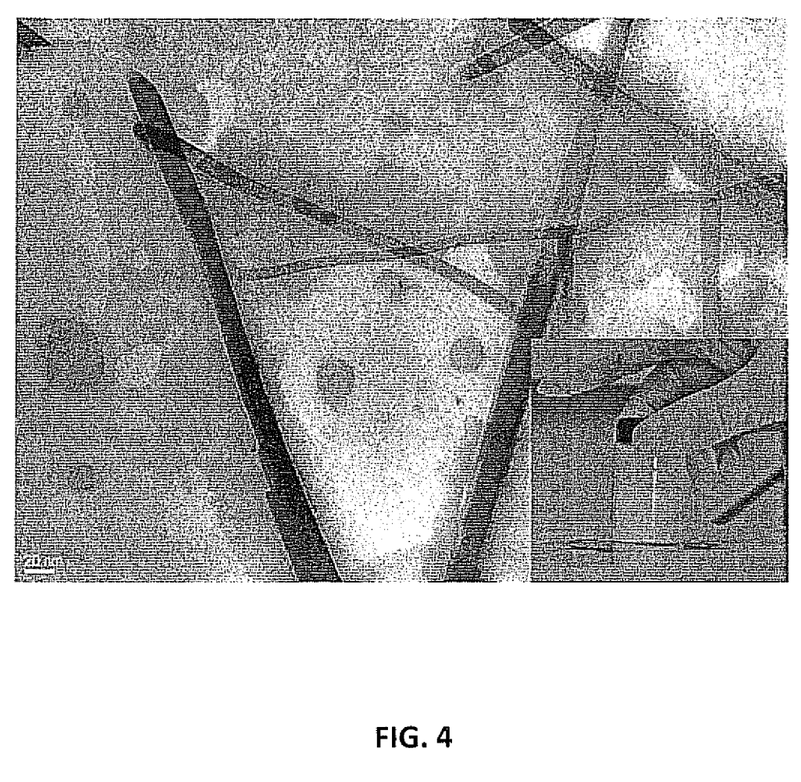
FIG. 4 is the TEM and the picture of CIGS nanoparticles/wires.

Finally, gradually adding Thiourea (e.g. 0.3 g) and 3-MPA (e.g., 2 mL) ("3-Mercaptopropionic Acid") into the mixture of solution A and B and a white nanoparticles-based solution is obtained. The transmission electron microscope ("TEM") and the picture of CIGS nanoparticles and nanowires network are shown in FIG. 4.

The procedures of preparing CIGS ink are described.

First, separating the CIGS nanoparticles/nanowires by methanol using centrifuging method up to five times;

Second, drying the centrifuged powder under vacuum pump under 100° C. (e.g. 60° C.) for less than 10 hours (e.g. 8 hours), dried powder with a white color is obtained;

Then, weighing the CIGS dried powder (e.g. 3.0 g), adding solvent methyl ethyl ketone ("MEK") (e.g. 70 mL) as the solvent and PEG (e.g. 30 mL) as the thickening agent and sodium hexametaphophate (SHMP) (e.g. 10 drops) as the dispersant, then mixing together and stirring for overnight to prepare the CIGS ink.

The procedures of ultrasonic spraying CIGS ink are described.

First, providing a clean Mo-coated glass substrate, using acetone, ethanol and DI water to wash the Mo-glass successively, finally using N2 to blow to dry.

Second, providing monodispersed CIGS ink (e.g. 100 mL) and storing in a bottle, extracting 30 mL ink into a syringe inside which is then ready to spray.

Then, set up the spraying parameters:

Run power of ultrasonic generator: P=less than 15 W (e.g. 5 W);

Temperature of the Mo-glass substrate: Ts=under 300° C. (e.g. 100° C.);

Spraying rate: V=greater than 1 ml/min. (e.g. 3 ml/min.);

Pressure of gas flow: P=greater than 5 Psi (e.g. 15 Psi);

Distance between the nozzle and the Mo-glass substrate: D=less than 150 mm (e.g. 90 mm);

Times of spray: n=less than 5 times (e.g. 3).

Automatically ultrasonic spraying the CIGS ink onto the Mo-glass under 300° C. (e.g. 100° C.) for less than 5 times (e.g. three times). Using ultrasonic spray technology can effectively reduce the aggregation effect and easy to obtain uniform and non-aggregated CIGS precursor films.

Figure 5:
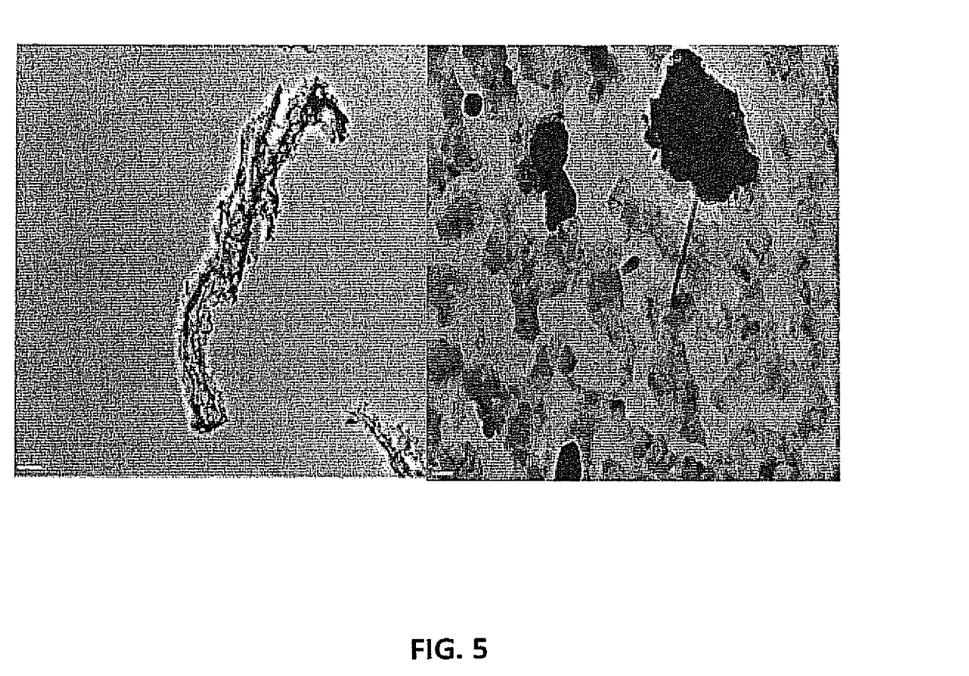
FIG. 5 is the TEM of decomposed CIGS nanowires.

The procedures of heating treatment are described. The process of heat treatment includes the following steps:

First, heating the CIGS nanoparticles/nanowires coated substrate up to 350° C. (e.g. 150-200° C.). All the particles are fused and become a clear solution. FIG. 5 shown the nanowires begin to decompose under 150° C.;

Second, heating the sample up to 450° C. (e.g. 250-300° C.). The solution gradually solidified and the color changes from clear to red, finally becoming a deep black. Meanwhile referring to FIG. 5, the networks (on right side of FIG. 5) are formed through the decomposed nanowires (on left side of FIG. 5).

Next the temperature is increased up to 500° C. (e.g. 350° C.) and held for half an hour, which will remove all the organic solvents and additives, finally the color changes to a deep black.

The procedures of selenization process are described.

Figure 6:
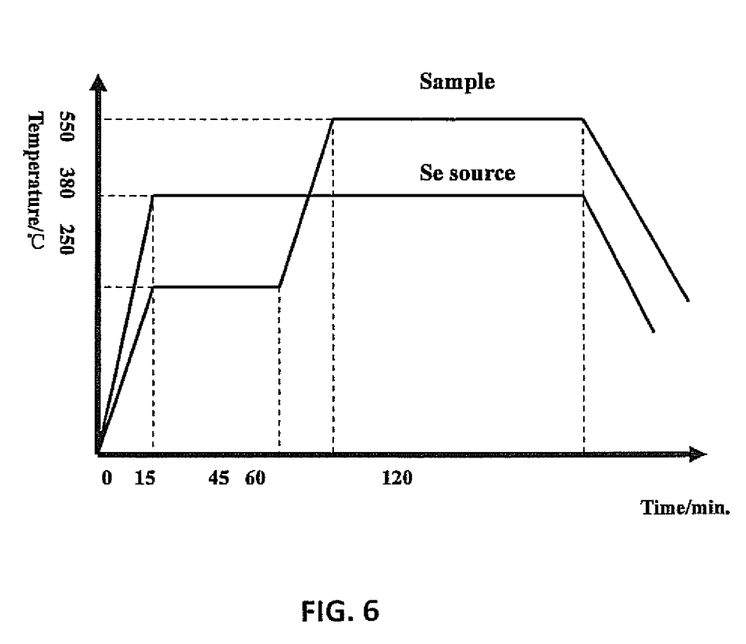
FIG. 6 is a diagram of the selenization temperature profile.

First, using Selenium powder (e.g. 2.0 g) as the solid-state Se-source and placing it in the graphite box, then placing it into the quartz tube of a selenization furnace at a low temperature zone. The temperature profile of Se-source is shown in FIG. 6;

Second, a sample is placed in the high temperature zone of selenization furnace, then using mixture of Ar or N as the protection gas and Selenizing the hot-treated precursor films above 500° C. (e.g. 550° C.) for 30-70 mins (e.g. 60 mins) in the selenization furnace. FIG. 6 shows the selenization temperature profile.

Figure 7:
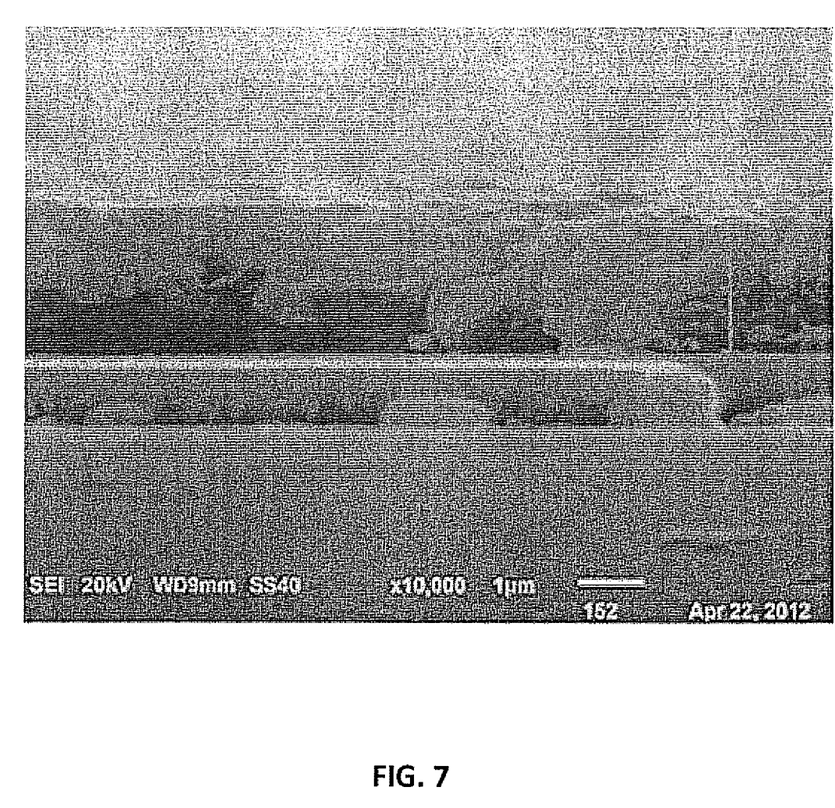
FIG. 7 is cross-sectional TEM of CIGSS films.

After selenization, we can get high-quality CIGSS absorb layer, as shown in FIG. 7.

The procedures of fabricating a CIGSS are described.

First, preparing CdS buffer layer through chemical bath deposition (CBD) method:

Using $CdSO_4$ (e.g. 0.065 g) and Thiourea (e.g. 1.14 g), adding 25 mL $NH_3H_2O$ and DI water (e.g. 200 mL), stirring and dissolving completely.

Then place the sample into the solution and heat up to 100° C. (e.g. 75° C.) for up to 30 mins (e.g. 15 mins). Taking the sample out and using DI water flushing and removing the aggregated CdS particles. In the end, drying in the oven below 100° C. (e.g. 80° C.) for 60-180 mins (e.g. 120 mins).

Second, sputtering i-ZnO and AZO window layers:

The sputtering depositing parameters of ZnO is shown as following: Sputtering power: P=100-200 W (e.g. 150 W); Sputtering pressure: P=0.5-10 mTorr (e.g. 4.5 mTorr); $Ar/O_2$=5:1-2:1 (e.g. 3:1); Gas Flow=10-100 sccm (e.g. 25 sccm); Sputtering time: T=up to 20 mins (e.g. 5 mins);

The sputtering depositing parameters of AZO is as following steps: Sputtering power: P=100-200 W (e.g. 150 W); Sputtering pressure: P=3-15 mTorr (e.g. 6.0 mTorr); Gas Flow=10-100 sccm (e.g. 25 sccm); Sputtering time: T=up to 30 mins (e.g. 20 mins).

Figure 8:
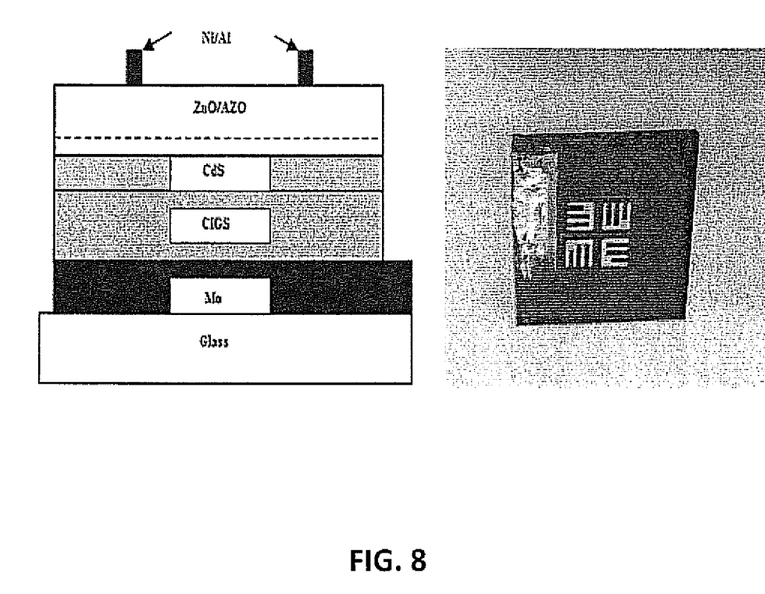
FIG. 8 is the structure diagram and picture of CIGSS device.

Finally, evaporating Ni—Al electrode:

Loading Ni wire (e.g. 0.5 g) and Al wire (e.g. 4 g). Sticking the sample with mask covered on the heating stainless steel plate. Sequentially evaporating Ni and Al wires under high vacuum background. FIG. 8 shows the structure diagram and picture of CIGSS device made in accordance with the invention.

The present invention allows the drawbacks of the known non-vacuum techniques to be eliminated. For this purpose, the invention provides a method for preparing CIGSS absorber layers by using a metal salt, thickening and binding agents to form uniform nanoparticle and nanowire networks and to provide a finished high quality CIGSS film after selenization, in which:

a) CIGS nanoparticles and nanowires are produced based on using a metal salt such as metal chloride and acetate at room temperature without inert gas protection;

b) A CIGS precursor layer is coated on a Mo glass substrate by ultrasonic sprying of the CIGS nanoparticle and nanowire solution;

c) Uniform nanoparticle and nanowire networks are generated by initial heat treatment;

d) A clean CIGS precursor layer is obtained by cleaning the residue salts and carbon agents at an increased temperature above 200° C.

e) High quality CIGSS film is fabricated after selenizing the pretreated precursor layer at a temperature above 400° C.

In the process of synthesizing CIGS nanoparticles and nanowires, the steps are performed under ambient condition and room temperature. No inert protection gas and equipments are required in our method and the reaction runs fast and all processes can be finished in a few minutes. No toxic chemicals are involved.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of preparing a CIGS-based solar cell comprising the steps of:

synthesizing soluble $CuInGaS_2$ nanoparticles/nanowires precursor at room temperature under non-vacuum condition by:

preparing a CIGS-based ink, adding CIGS powder into specific solvent and adding additives to form monodispersed CIGS ink;

ultrasonic spraying CIGS ink on Mo-coated substrate, using ultrasonic spray to reduce the aggregation effect of GIGS nanoparticles/nanowires and obtaining uniform CIGS precursor films;

heat treating of the CIGS precursor films to melt soluble CIGS nanopowder and change it to a clear solution, and cooling the solution to dry to a uniform and black color CIGS precursor film;

selenizing the heat treated CIGS precursor films, using Se powder as the Se-source and, creating high quality CIGSS films after selenizing the precursor films in a double zone furnace for approximately 30-70 minutes; and preparing a CIGSS device by chemical bath deposition and sputtering and evaporating step, wherein said step of synthesizing CIGS nanoparticles/nanowires comprises the steps of:
(a) providing a solution comprising Cu, In and Ga ions, the ratio of Cu, In and Ga being in the following proportions: Cu 0.9~1; In 0.6~0.8 and Ga 0.4~0.2;
(b) providing a thickening solution;
(c) providing a sulfurated precipitant;
(d) providing an effective coupling agent;
(e) adding the solution comprising Cu, In and Ga ions into said thickening solution and stirring the mixture to form a homogeneous solution; and
(f) sequentially adding appropriate amounts of sulfurated precipitant and coupling agent into above homogeneous solution and stirring the mixture to form $CuInGaS_2$ nanoparticles/nanowires in a well dispersed solution.

2. A method as defined in claim 1, wherein a metal salt is used to produce said nanoparticles and nanowires comprising at least one of a metal chloride and a metal acetate.

3. A method as defined in claim 1, wherein said step of preparing the CIGS-based ink comprises the steps of:
(a) separating the CIGS nanoparticles/nanowires by centrifuging method;
(b) washing and drying the centrifuged CIGS nanoparticles/wires under vacuum pump and low temperature;
(c) providing the high volatilizing solvent with low boiling point;
(d) providing a small amount of additives, such as dispersants and thickening agents; and
(e) weighing an appropriate amount of CIGS solid powder, adding into the organic solvent and some additives, stirring for overnight to form a uniform ink.

4. A method as defined in claim 1, wherein said step of ultrasonic spraying CIGS ink on Mo-coated substrate comprises the steps of:
(a) providing a Mo-coated substrate;
(b) providing monodisperse CIGS ink; and
(c) automatically ultrasonically spraying the CIGS ink onto the Mo-coated substrate a plurality of times under 300° C.

5. A method as defined in claim 4, wherein said CIGS ink is sprayed less than five times onto the Mo-coated substrate.

6. A method as defined in claim 1, wherein said selenizing step comprises the steps of:
(a) providing pre-treated CIGS precursor films; and
(b) selenizing the hot-treated precursor films at a temperature above 500° C. for approximately 60 minutes in a selenization furnace using Selenium powder as the Se-source to obtain a high-quality CIGSS absorber layer.

7. A method as defined in claim 1, wherein said step of preparing said CIGSS device comprises the steps of:
(a) depositing a buffer layer of CdS employing CBD method;
(b) sputtering a window layer of i-ZnO and a conductive AZO layer; and
(c) evaporating Ni/Al top-electrode to form a CIGSS PV device with structure of glass/Mo/CIGSS/CdS/i-ZnO/AZO/Ni—Al.

8. A method as defined in claim 1, wherein said ultrasonic spraying CIGS ink comprises the steps of:
(a) providing a clean Mo-coated glass substrate, using acetone, ethanol and DI water to wash the Mo-coated substrate successively, finally using $N_2$ to blow to dry;
(b) providing monodispersed CIGS ink and storing in a container, extracting ink for ultrasonic spraying under following conditions or parameters:
running power of ultrasonic generator: P=less than 15 W;
temperature of the Mo-coated substrate: Ts=under 300° C.;
spraying rate: V=greater than 1 ml/min;
pressure of gas flow: P=greater than 5 Psi;
distance between the nozzle and the Mo-coated substrate: less than 150 mm;
number of sprays: n=less than 5 times;
whereby CIGS ink is ultrasonically sprayed onto the Mo-coated substrate under 300° C. for less than five times, aggregation effect is reduced to obtain uniform and non-aggregated CIGS precursor films.

9. A method as defined in claim 1, wherein said step of selinization comprises the steps of:
(a) using Se powder as the solid-state Se-source and placing the Se powder in a graphite box, of a low temperature zone of a selenization furnace, heating the Se powder to form Se vapor and carrying the Se vapor through a quartz tube; and
(b) placing the graphite box in a high temperature zone of the selenization furnace, and then using a mixture of Ar or N as the protection gas.

10. A method as defined in claim 1, wherein the selenization time is approximately 60 mins.

11. A method of preparing a CIGS-based solar cell comprising the steps of:
synthesizing soluble $CuInGaS_2$ nanoparticles/nanowires precursor at room temperature under non-vacuum condition by:
preparing a CIGS-based ink, adding CIGS powder into specific solvent and adding additives to form monodispersed CIGS ink;
ultrasonic spraying CIGS ink on Mo-coated glass substrate, using ultrasonic spray to reduce the aggregation effect of CIGS nanoparticles/nanowires and obtaining uniform CIGS precursor films;
heat treating of the CIGS precursor films to melt soluble CIGS nanopowder and change it to a clear solution, and cooling the solution to dry to a uniform and black color CIGS precursor film;
selenizing the heat treated CIGS precursor films, using Se powder as the Se-source and, creating high quality CIGSS films after selenizing the precursor films in a double zone furnace for approximately 30-70 minutes; and
preparing a CIGSS device by chemical bath deposition and sputtering and evaporating step, wherein said step of synthesizing CIGS nanoparticles/nanowires based solution comprises the steps of:

(a) synthesizing a CuInGa precursor solution A by: Adding CuCl$_2$.2H$_2$O, InCl$_3$ and GaCl$_3$ into Methanol, stirring for up to 30 min and a green color solution is obtained;
(b) synthesizing a thickening solution B by: adding ethyl cellulose (EC) into Terpinol, stirring overnight and heating up to a temperature of 200° C. until it is completely dissolved;
(c) mixing solution A and thickening agent solution B, and stirring for up to 5 hours; and
(d) gradually adding Thiourea and 3-MPA into the mixture of solution A and B to obtain a white nanoparticles-based solution.

12. A method of preparing a CIGS-based solar cell comprising the steps of:
synthesizing soluble CuInGaS$_2$ nanoparticles/nanowires precursor at room temperature under non-vacuum condition by:
preparing a CIGS-based ink, adding CIGS powder into specific solvent and adding additives to form monodispersed CIGS ink;
ultrasonic spraying CIGS ink on Mo-coated glass substrate, using ultrasonic spray to reduce the aggregation effect of CIGS nanoparticles/nanowires and obtaining uniform CIGS precursor films;
heat treating of the CIGS precursor films to melt soluble CIGS nanopowder and change it to a clear solution, and cooling the solution to dry to a uniform and black color CIGS precursor film;
selenizing the heat treated CIGS precursor films, using Se powder as the Se-source and, creating high quality CIGSS films after selenizing the precursor films in a double zone furnace for approximately 30-70 minutes; and
preparing a CIGSS device by chemical bath deposition and sputtering and evaporating step, wherein said step of preparing the CIGS-based ink comprises the steps of:
(a) separating the CIGS nanoparticles/nanowires by methanol using centrifuging method up to five times;
(b) drying the centrifuged powder under vacuum pump under 100° C. for less than ten hours to obtain white color dried powder;
(c) weighing the CIGS dried powder, adding MEK as the solvent and PEG as the thickening agent and SHMP as the dispersant, then mixing together and stirring overnight to form CIGS ink.

13. A method of preparing a CIGS-based solar cell comprising the steps of:
synthesizing soluble CuInGaS$_2$ nanoparticles/nanowires precursor at room temperature under non-vacuum condition by:
preparing a CIGS-based ink, adding CIGS powder into specific solvent and adding additives to form monodispersed CIGS ink;
ultrasonic spraying CIGS ink on Mo-coated substrate, using ultrasonic spray to reduce the aggregation effect of CIGS nanoparticles/nanowires and obtaining uniform CIGS precursor films;
heat treating of the CIGS precursor films to melt soluble CIGS nanopowder and change it to a clear solution, and cooling the solution to dry to a uniform and black color CIGS precursor film;
selenizing the heat treated CIGS precursor films, using Se powder as the Se-source and, creating high quality CIGSS films after selenizing the precursor films in a double zone furnace for approximately 30-70 minutes; and
preparing a CIGSS device by chemical bath deposition and sputtering and evaporating step, wherein said heat treatments step comprises:
(a) heating the CIGSS nanoparticles/nanowires coated substrate up to 350° C. to fuse all the particles to become a clear solution;
(b) heating the CIGS nanoparticles/nanowires coated substrate up to 450° C. gradually solidify the solution and the color changes from clear to red, and finally becomes deep black and the networks are formed through the decomposed nanowires; and
(c) increasing the temperature up to 500° C. and holding the temperature for half an hour to remove all the organic solvents and additives to finally cause the color to change to deep black.

14. A method of preparing a CIGS-based solar cell comprising the steps of:
synthesizing soluble GuInGaS$_2$ nanoparticles/nanowires precursor at room temperature under non-vacuum condition by:
preparing a CIGS-based ink, adding CIGS powder into specific solvent and adding additives to form monodispersed CIGS ink;
ultrasonic spraying GIGS ink on Mo-coated substrate, using ultrasonic spray to reduce the aggregation effect of GIGS nanoparticles/nanowires and obtaining a uniform GIGS precursor film;
heat treating of the GIGS precursor film to melt soluble GIGS nanopowder and change it to a clear solution, and cooling the solution to dry to a uniform and black color GIGS precursor film;
selenizing the heat treated GIGS precursor film, using Se powder as the Se source and, creating high quality CIGSS film after selenizing the precursor film in a double zone furnace for approximately 30-70 minutes; and
preparing a CIGSS device by chemical bath deposition and sputtering and evaporating step, wherein said step of fabricating comprises the steps of:
(a) preparing a CdS buffer layer through a chemical bath deposition (CBD) method, comprising:
(b) using CdSO$_4$ and Thiourea, adding NH$_3$H$_2$O and DI water, stirring and dissolving completely;
(c) placing the GIGS precursor film into a solution and heating up to 100° C. for up to 30 minutes and removing the GIGS precursor film and using DI water flushing for removing the aggregated CdS particles and drying in an oven below 100° C. for 60-180 minutes;
(d) sputtering i-ZnO and AZO window layers,
(e) the sputtering depositing parameters of ZnO being as follows: sputtering power: P=100-200W; sputtering pressure: P=0.5-10 mTorr; Ar/O$_2$=5:1-2:1; gas flow=10-100 sccm; sputtering time: T=up to 20 minutes;
(f) sputtering depositing parameters of AZO being as follows sputtering power: P=100-200W; gas flow=10-100 scorn; sputtering time: T=up to 30 minutes;
(g) evaporating Ni—Al electrode comprising:
(h) loading NI wire and Al wire and sequentially evaporating Ni and Al wires under high vacuum background to create a CIGSS device.

* * * * *